UNIVERSAL CIRCUIT BOARD AND METHOD OF FORMING SAME

Filed Nov. 15, 1968

INVENTORS
NORMAN H. HORWITZ
ANN L. FORSAITH
BY
Burton & Parker
ATTORNEYS

United States Patent Office 3,493,671

Patented Feb. 3, 1970

3,493,671

UNIVERSAL CIRCUIT BOARD AND METHOD OF FORMING SAME

Norman H. Horwitz, Birmingham, and Ann L. Forsaith, Troy, Mich., assignors of one-fourth each to James E. Lofstrom, Birmingham, Mich., and Kenneth J. Cook, Oak Park, Mich.

Filed Nov. 15, 1968, Ser. No. 776,052
Int. Cl. H05k *1/04*
U.S. Cl. 174—68.5 14 Claims

ABSTRACT OF THE DISCLOSURE

A universal circuit board having two groups of parallel conductive strips mounted on opposite faces of a nonconductive sheet, with one group substantially perpendicular to the other. The conductive strips include a plurality of holes at the points of superimposition of the groups of perpendicular conductive strips, and a pair of opposed notches extending through the longitudinal edges of the strips, spaced between the holes. The nonconductive sheet is imperforate at the location of the holes in the conductive strips. The holes and notches may be formed simultaneously with the forming of the conductive strips.

DESCRIPTION OF THE PRIOR ART

The development of printed circuits has provided many advantages over previous techniques, including rigidity, reliability, reduction of cost, and a readily reproducible circuit. The conventional printed circuit board, however, is often not suitable for production of small quantities of circuits, or special circuits, because the drafting, photographic, and etching processes required are time consuming and expensive. This is particularly true in experimental work, which generally requires frequent changes in the circuit.

The problem of providing a relatively inexpensive circuit board for experimental use has been partially solved by the commercially available plug boards, or *x-y* circuit boards, which include one group of parallel conductive strips, or clad strips, mounted on one side of the nonconductive substrate sheet, and a second group mounted on the opposite side perpendicular to the first group. A hole is then punched through the clad and substrate at each of the points of superimposition of the clad strips, permitting receipt of connecting pins and circuit components, and providing an interfacial electrical connection between strips on opposite sides of the board. The holes substantially reduce the structural rigidity of the substrate sheet, and therefore cannot be punched simultaneously, and are punched in a multiple stage progressive die. This design and method is nevertheless considerably less expensive than conventional printed circuit boards for limited quantities, and experimental use, and permits rapid design work. Examples of the punch board, *x-y* circuit board, and similar designs, include the following United States patents: 2,883,447, 3,021,498, 3,065,439, 3,179,913, 3,193,731, 3,205,469.

The perforation process of the *x-y* circuit boards described above represents a considerable portion of the cost of the circuit board, and substantially reduces the structural integrity of the board, as described above, which may result in breakage during shipment or packaging. Further, the conductivity of each of the conducting strips is substantially reduced, because of the requisite hole sizes to receive the connector pins and circuit components. We have discovered that less than ten percent of the holes in an *x-y* circuit board are utilized in a conventional circuit, and therefore the disadvantages of this circuit board are not necessary.

SUMMARY OF THE INVENTION

This invention relates to a universally adaptable conductive circuit board, including a substantially flat sheet of electrically nonconductive material or substrate, a first group of substantially parallel spaced electrically conductive strips, or clad strips mounted on one surface of the substrate, and a second group of substantially parallel spaced electrically conductive strips mounted on the opposite face of the substrate, substantially perpendicular to the first group. The electrically conductive strips are perforated at the points of superimposition of the groups of mutually perpendicular conductive strips, and the substrate is substantially homogeneous and imperforate between the perforations in the strips. In the preferred embodiment of the invention, a notch or pair of opposed notches are provided through the longitudinal edges of the conductive strips, between the spaced perforations, adapted to permit cutting the strip at the location of the notches to electrically isolate sections of the strip.

The perforations or holes are preferably provided in the longitudinal axis of the strip, and have a diameter less than one-half the width of the strip to avoid significant loss of conductivity of the strip. In the disclosed embodiment of this invention, the diameter of the holes is equal to approximately one-third the width of the strip. The notches in the disclosed embodiment are also generally semicircular, and extend through the longitudinal edges of the conductive strips a distance equal to less than one-quarter of the thickness of the conductive strips.

It is important to note that the holes in the clad or conductive strips do not extend through the substrate or nonconductive sheet, thus retaining the structural integrity of the circuit board. Further, the holes may be formed simultaneously with the forming of the conductive strips, as by etching. The strips therefore have a greater conductivity than the conventional *x-y* circuit boards, because the holes may have a considerably smaller diameter. Further, a continuous strip may be very important in mounting certain electrical components. The requisite holes may also be drilled to arbitrary size, for mounting special components or hardware. The requisite breaks in the conductive strips to interrupt the circuit, may be accomplished with conventional tools.

The method of forming a universally adaptable conductive circuit board of this invention includes applying a conductive metal coating or clad to opposite faces of a nonconductive sheet or substrate, removing a plurality of parallel conductive strips from opposite faces of the nonconductive sheet to provide two groups of mutually perpendicular conductive strips on opposite sides of the substrate, and simultaneously forming a plurality of holes extending through the clad strips, but not through the substrate sheet, at the points of superimposition of the groups of mutually perpendicular conductive strips. The notches described hereinabove may also be formed simultaneously with the forming of the conductive strips and holes, such as in the etching process. Finally, the ultimate consumer forms a plurality of holes through the substrate sheet, through the holes provided in the clad strips, but only as required by the particular electrical circuit to be provided on the circuit board. The strips may be cut with a conventional tool, such as a chisel, or rotating cutting tool, at the notches.

Other advantages and meritorious features will more fully appear from the following description, claims, and accompanying drawings, wherein:

DESCRIPTION OF THE PREFERRED EMBODIMENT AND METHOD

Figure 1:
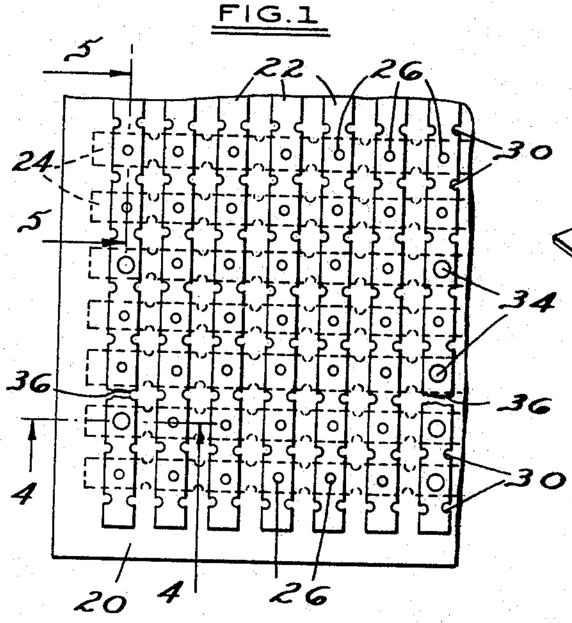
FIGURE 1 is a top elevation of one embodiment of the universal circuit board of this invention.
Figure 2:
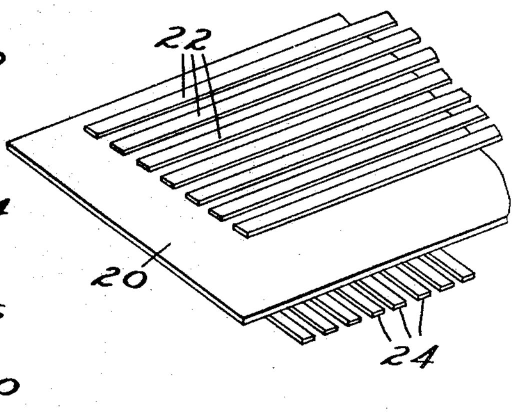
FIGURE 2 is an exploded schematic perspective view of the circuit board shown in FIGURE 1.

The embodiment of the universal circuit board shown in the drawings includes a substantially flat sheet of nonconductive material or substrate 20, a first group of substantially parallel spaced electrically conductive clad strips 22 mounted on one surface of the substrate sheet, and a second group of parallel clad strips 24 mounted on the opposite face of the substrate, substantially perpendicular to the first group.

Figure 3:
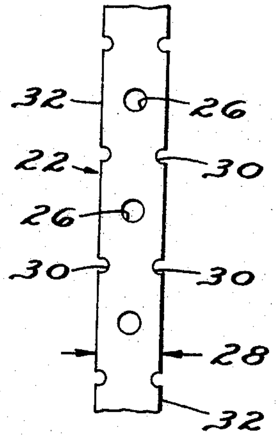
FIGURE 3 is an enlarged top view of one conductive strip shown in FIGURE 1.
Figure 4:
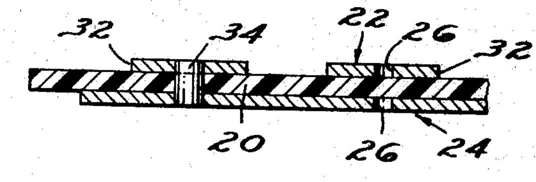
FIGURE 4 is a cross sectional view of the circuit board shown in FIGURE 1, in the direction of view arrows 4—4.
Figure 5:
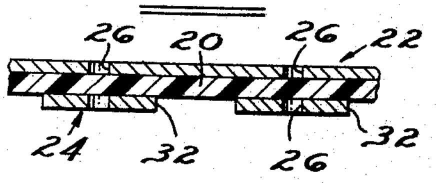
FIGURE 5 is a cross sectional view of the circuit board shown in FIGURE 1, in the direction of view arrows 5—5.

The clad strips are each provided in a plurality of holes or perforations 26 at the points of superimposition of the spaced intersections of the groups of clad strips. The holes are preferably circular, and are defined generally in the longitudinal axis of the clad strips. The diameter of the holes is preferably less than one half the width 28 of the clad strip, as shown in FIGURE 3, to prevent a significant loss of conductivity in the clad strips, as described hereinabove. In the disclosed embodiment, the diameter of the apertures 26 is equal to approximately one third the width 28 of the strip.

The clad strips in the preferred embodiment of the invention are also provided with a pair of notches 30, as shown in FIGURES 1 and 3, substantially evenly spaced between each of the holes 26. The notches extend through the longitudinal edges 32 of the clad strips, and are generally circular in this embodiment. The distance the notches extend into the edges of the strip, or the depth of the notches, is preferably less than one quarter of the width of the clad strip to prevent a significant loss in conductivity, as described hereinabove. The depth of the notches in this embodiment is approximately one sixth the width of the strip. The purpose and function of the holes and notches will be explained hereinbelow.

It is important to note that the substrate, or non-conductive sheet 20 is imperforate or unperforated at the location of the holes 26; or stated another way, the perforations in the clad strip do not extend through the substrate sheet. The holes and notches may therefore be formed simultaneously with the forming of the clad strips, by conventional printed circuit techniques. A continuous clad layer of a conductive material is generally first mounted on opposite surfaces of the substrate sheet, as by electrochemical or chemical deposit techniques. The electrically conductive material is generally a metal, such as silver, copper or various copper alloys. The nonconductive substrate sheet may also be formed from conventional materials including phenolic resins, epoxy glass, or other materials having the requisite mechanical and electrical insulating properties. The areas between the clad strips 22 and 24, and the holes and notches are then removed by conventional printed circuit techniques, including photographic etching or silk screening. The universally adaptable circuit board of this invention is ready for use in this form.

The advantages of the universal circuit board of this invention, over the punch board or *x-y* circuit board described hereinabove, include a substantial reduction in cost, improved structural integrity both before and after use, greater conductivity of the clad strips, and greater versatility. The elimination of the holes at every juncture in the substrate has resulted in a cost saving of approximately eighty percent, and special components may now be used requiring special hole sizes.

The method of forming a universal circuit board of this invention includes applying a conductive metal coating or clad to the substrate sheet 20, as described above; removing portions of the clad to define a first group of substantially parallel clad strips 22 on one face of the substrate, and a second group of parallel clad strips on the opposite face, substantially perpendicular to the first group; and simultaneously forming the holes 26 and notches 30 in the clad strips.

The circuit board of this invention is utilized by perforating substrate sheet 20 between the holes 26 on opposite sides of the sheet, as required by the particular circuit to be formed. This may be accomplished by a drill, a hot punch, or similar techniqes. We have found that at most only ten percent of the holes are utilized in a conventional circuit. Therefore, the resultant circuit will also be stronger than the punch boards described hereinabove.

Interfacial connector pins 36 may then be inserted into the drilled holes, and the circuit elements such as resistors, capacitors and diodes may be introduced over the breaks 36 formed in the clad strips. Portions of the clad strips may be isolated from the remainder of the strip by interrupting the strip with a suitable tool, such as a pointed chisel, rotary cutting tool or burr removing tool. Breaks in the conducting strips are shown at 36 in FIGURE 1. The circuit, if suitable for the intended purpose, can be then preserved by soldering the pins to opposite sides of the circuit board. If errors are found, or if changes are to be made, the pins can easily be removed before soldering. It is also possible to remove the pins after soldering with little or no damage to the clad strips. It is also possible to connect an integrated circuit leg to either side of the board, or both sides, by limiting the length of the connector legs of the integrated circuit components. It is also possible to introduce "hidden" arrays of conducing strips between laminations of the circuit board, such that additional circuits may be introduced. Contact is made to the hidden conductor strips by tabs or studs which emerge at the end of the board. Where permanence and protection from the environment is required, the completed board may be sprayed or dipped with a protective varnish, lacquer or epoxy to provide additional rigidity and electrical insulation between the clad strips. The method described of forming a universal circuit board described hereinabove may also be utilized in combination with an automatic tape programmed machine. By a suitably programmed automatic device, it is possible to drill holes and drop pins into the required positions, and introduce breaks in the clad strips where required. The resultant circuit will be identical to the circuit obtained in an *x–y* circuit board, or punch board, except that holes are provided in the substrate only where required.

What is claimed is:

1. A universally adaptable conductive circuit board, comprising: a substantially flat sheet of electrically nonconductive material, a first group of substantially parallel spaced electrically conductive strips mounted on one surface of said nonconductive sheet, and a second group of substantially parallel spaced electrically conductive strips mounted on the opposite face of said nonconductive sheet substantially perpendicular to said first group, said electrically conductive strips perforated at the points of superimposition of the groups of mutually perpendicular conductive strips, and said nonconductive sheet substantially homogeneous and imperforate at said points.

2. The circuit board defined in claim 1, characterized in that said conductive strips each include a notch spaced between said perforations, adapted to permit cutting said strip at the location of the notches to electrically isolate the strip including the perforation from the remainder of the strip.

3. The circuit board defined in claim 2, characterized in that each strip includes two opposed notches extending through the longitudinal edges of said strip toward the axis thereof, but spaced therefrom, which do not interrupt the electrical continuity of the strip.

4. The circuit board defined in claim 3, characterized in that said notches are generally semicircular.

5. The circuit board defined in claim 4, characterized in that said notches are substantially evenly spaced between the perforations in the conductive strip.

6. The circuit board defined in claim 1, characterized in that said perforations are substantially circular and have a diameter equal to less than one half the width of said conductive strips.

7. The circuit board defined in claim 6, characterized in that the diameter of said perforations are equal to approximately one third the width of said conductive strips.

8. A universally adaptable conductive circuit board, comprising: a substantially flat sheet of nonconductive material, a first group of substantially parallel spaced electrically conductive strips mounted on one face of said nonconductive sheet, and a second group of substantially parallel electrically conductive strips mounted on the opposed face substantially perpendicular to said first group, said electrically conductive strips including a plurality of generally circular holes at the points of superimposition of said groups of mutually perpendicular strips, substantially in the longitudinal axis of said strips, having a diameter equal to less than one half the width of said strips, and a pair of opposed notches extending through the longitudinal edges of said strips, but spaced from the axis thereof, between each of the holes, said nonconductive sheet imperforate at the points of superimposition of the mutually perpendicular groups of conductive strips.

9. The universally adaptable conductive circuit board defined in claim 8, characterized in that the diameter of the holes is equal to approximately one third the width of the strips.

10. The universally adaptable conductive circuit board defined in claim 8, characterized in that said notches extend into said conductive strips a distance equal to less than one quarter of the width of said conductive strips.

11. The universally adaptable conductive circuit board defined in claim 10, characterized in that said notches are generally semicircular.

12. A method of forming a universally adaptable conductive circuit board, including the steps of;

(a) applying a conductive metal coating to opposed faces of a nonconductive sheet, (b) removing a plurality of substantially parallel conductive strips from opposite faces of the nonconductive sheet to provide two groups of mutually perpendicular conductive strips on opposite sides of said conductive sheet, and simultaneously forming a plurality of holes extending through said conductive strips, but not through said nonconductive sheets, at the points of superimposition of the groups of mutually perpendicular conductive strips.

13. The method of forming a circuit board defined in claim 12, including forming a plurality of notches spaced between the holes in said strips simultaneously with the forming of said holes.

14. The method of forming a circuit board defined in claim 13, including subsequently forming a plurality of holes through said nonconductive sheet, through the holes provided through said nonconductive strips, as required by the particular electrical circuit to be provided on the circuit board, and cutting the strip through said notches to isolate predetermined sections of said strips as required by said circuit.

References Cited

UNITED STATES PATENTS

| | | | |
|---|---|---|---|
| 2,883,447 | 4/1959 | Dahl | 174—68.5 |
| 2,963,626 | 12/1960 | Du Val et al. | 174—68.5 XR |
| 2,965,812 | 12/1960 | Bedford. | |

FOREIGN PATENTS

| | | | |
|---|---|---|---|
| 245,507 | 7/1947 | Switzerland. | |

DARRELL L. CLAY, Primary Examiner

U.S. Cl. X.R.

29—625; 156—3; 317—101